(12) United States Patent
Bossard et al.

(10) Patent No.: US 10,594,523 B2
(45) Date of Patent: Mar. 17, 2020

(54) DECODER CIRCUIT FOR A BROADBAND PULSE AMPLITUDE MODULATION SIGNAL

(71) Applicant: Tetra Semiconductors AG, Zürich (CH)

(72) Inventors: Martin Bossard, Zürich (CH); Jörg Wieland, Küsnacht (CH)

(73) Assignee: TETRA SEMICONDUCTOR AG, Zürich (CH)

( * ) Notice: Subject to any disclaimer, the term of this patent is extended or adjusted under 35 U.S.C. 154(b) by 0 days.

(21) Appl. No.: 15/852,513

(22) Filed: Dec. 22, 2017

(65) Prior Publication Data

US 2019/0199560 A1 Jun. 27, 2019

(51) Int. Cl.
| | |
|---|---|
| *H04L 25/49* | (2006.01) |
| *H04L 27/06* | (2006.01) |
| *H04L 1/00* | (2006.01) |
| *G01R 29/26* | (2006.01) |
| *G11B 20/14* | (2006.01) |

(52) U.S. Cl.
CPC .......... *H04L 25/4917* (2013.01); *G01R 29/26* (2013.01); *H04L 1/0055* (2013.01); *H04L 25/4902* (2013.01); *H04L 27/06* (2013.01); *G11B 2020/1442* (2013.01)

(58) Field of Classification Search
CPC .............. G01R 31/31708; G01R 29/26; G01R 31/31715; G01R 31/31932; G01R 13/0218; G01R 27/2623; G01R 31/3177
USPC .......................................... 375/251; 330/134
See application file for complete search history.

(56) References Cited

U.S. PATENT DOCUMENTS

| | | | | |
|---|---|---|---|---|
| 2004/0109509 A1* | 6/2004 | Stonecypher | ....... | H04L 25/4915 375/286 |
| 2009/0238301 A1* | 9/2009 | Cheung | ................. | H04L 25/063 375/291 |
| 2015/0091742 A1* | 4/2015 | Ionita | ...................... | H03M 5/18 341/57 |
| 2015/0207474 A1* | 7/2015 | Seong | ..................... | H03F 3/193 330/295 |
| 2015/0207574 A1* | 7/2015 | Schoen | ............. | G01R 31/3171 375/224 |

* cited by examiner

*Primary Examiner* — David C Payne
*Assistant Examiner* — Sarah Hassan
(74) *Attorney, Agent, or Firm* — Knobbe, Martens, Olson & Bear, LLP (57) ABSTRACT

Disclosed is a decoder circuit for a pulse amplitude modulation signal and a method of decoding a pulse amplitude modulation signal. The pulse amplitude modulation signal has a zeroth signal level, a first signal level, a second signal level and a third signal level. The decoder circuit comprises a first decision circuit, and a mapping circuit. The first decision circuit receives the pulse amplitude modulation signal and generates a low output signal for the first and the zeroth signal level, and generates a high output signal for the third and the second signal level. The mapping circuit receives the pulse amplitude modulation signal and generates a low output signal for the second and first signal level, and generates a high output signal for the third and zeroth signal level. Optionally, the decoder circuit comprises a logic circuit. The logic circuit receives the generated signal of the mapping circuit and the generated signal of the first decision circuit and generates a low output signal or a high output signal according to a predetermined truth table.

22 Claims, 8 Drawing Sheets

| MSB | LSB | PAM-4 |
|---|---|---|
| 1 | 1 | L3 |
| 1 | 0 | L2 |
| 0 | 1 | L1 |
| 0 | 0 | L0 |

| MSB | LSB | PAM-4 |
|---|---|---|
| 1 | 1 | L3 |
| 1 | 0 | L2 |
| 0 | 1 | L1 |
| 0 | 0 | L0 |

Fig. 1

| 0 | 0 | 1 | 1 | 1 | 1 | 0 | 0 | 0 | ← MSB |
|---|---|---|---|---|---|---|---|---|---|
| 1 | 0 | 0 | 1 | 0 | 1 | 0 | 0 | 1 | ← LSB |
| L1 | L0 | L2 | L3 | L2 | L3 | L0 | L0 | L1 | ← PAM-4 |

| M | d1 | MSB=d1 | LSB= XNOR (M, d1) | PAM-4 |
|---|---|---|---|---|
| high_m | high_1 | 1 | 1 | L3 |
| low_m | high_1 | 1 | 0 | L2 |
| low_m | low_1 | 0 | 1 | L1 |
| high_m | low_1 | 0 | 0 | L0 |

| Gray code | MSB | LSB | PAM-4 |
|---|---|---|---|
| | 1 | 0 | L3 |
| | 1 | 1 | L2 |
| | 0 | 1 | L1 |
| | 0 | 0 | L0 |

Fig. 8

| M | d1 | MSB=d1 | LSB=$\overline{M}$ | PAM-4 |
|---|---|---|---|---|
| | | | Gray code | |
| high_m | high_1 | 1 | 0 | L3 |
| low_m | high_1 | 1 | 1 | L2 |
| low_m | low_1 | 0 | 1 | L1 |
| high_m | low_1 | 0 | 0 | L0 |

DECODER CIRCUIT FOR A BROADBAND PULSE AMPLITUDE MODULATION SIGNAL

BACKGROUND

This disclosure relates to a decoder circuit for decoding a pulse amplitude modulation signal having multiple signal levels. In particular, this disclosure relates to a decoder circuit for decoding a broadband pulse amplitude modulation signal transmitted over optical links, a broadband pulse amplitude modulation signal in the field of backplane appliances and a broadband pulse amplitude modulation signal in similar applications.

In telecommunications, a non-return-to-zero (NRZ) signal enables encoding of bit streams, wherein the ones of the bit stream are represented by one significant condition, such as a positive voltage, and the zeros of the bit stream are represented by another significant condition, such as a negative voltage. The NRZ signal has no other neutral or rest condition. NRZ is a form of pulse amplitude modulation (PAM), where message information is encoded into the amplitude of signal pulses. NRZ refers to a modulation where one bit at a time is mapped into two possible signal amplitudes. PAM-4 refers to a modulation where two bits at a time are mapped into four possible signal amplitudes. For a given baud rate, PAM-4 can transmit up to twice the number of bits as NRZ. Correspondingly, a PAM-8 refers to a modulation where three bits at a time are mapped into eight possible signal amplitudes. For a given baud rate, PAM-8 can transmit up to three times the number of bits as NRZ. Other signals than NRZ, PAM-4 or PAM-8 are possible, such as PAM-12, PAM-16, etc.

In a PAM-4 based link, on the transmitting end, an encoder may combine two bit streams and create a single four-level signal, which is the PAM-4 signal. One of the bit streams corresponds to a Most Significant Bit (MSB). The other of the bit streams corresponds to a Least Significant Bit (LSB). On the receiving end, a decoder circuit may separate the PAM-4 signal into the two individual bit streams corresponding to the MSB and the LSB.

In an alternative embodiment, on the transmitting end, an encoder may encode a single bit stream into a PAM-4 signal.

In an alternative embodiment, on the receiving end, a decoder circuit may decode a PAM-4 signal into a single bit stream.

In an alternative embodiment, such as in the case of a repeater, a device may have an input for receiving a PAM-4 signal and an output for transmitting a PAM-4 signal, wherein the device may include at least a decoder circuit for decoding the received PAM-4 signal.

Figure 1:
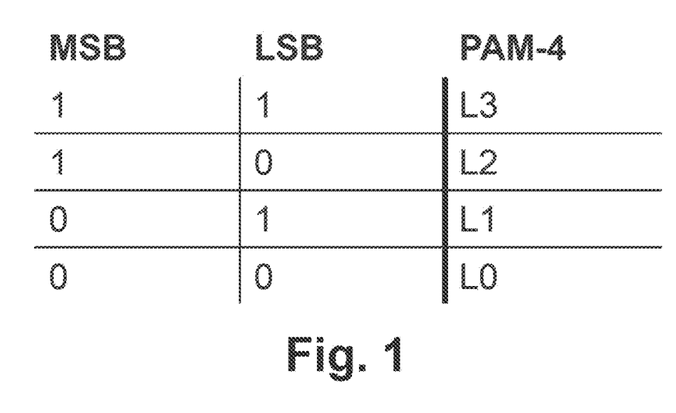
FIG. 1 illustrates a PAM-4 coding table.

FIG. 1 illustrates a PAM-4 coding table, which defines the mapping of an MSB and an LSB into the PAM-4 signal levels. The combination MSB=1, LSB=1 is encoded into the PAM-4 signal level L3. The combination MSB=1, LSB=0 is encoded into the PAM-4 signal level L2. The combination MSB=0, LSB=1 is encoded into the PAM-4 signal level L1. The combination MSB=0, LSB=0 is encoded into the PAM-4 signal level L0.

Figure 2:
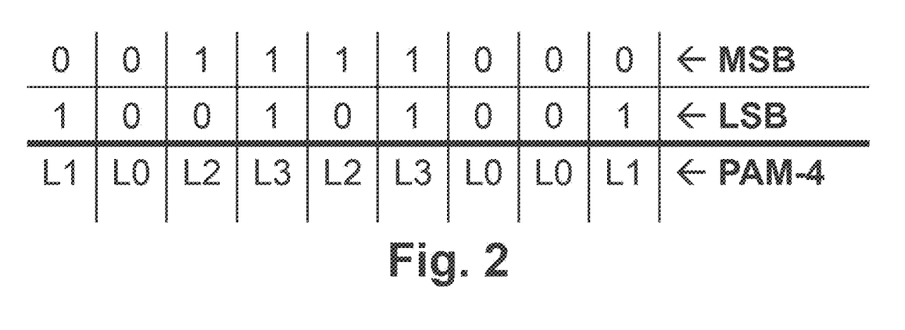
FIG. 2 illustrates a PAM-4 coding example of a sequence of MSBs and LSBs encoded into PAM-4 signal levels.

FIG. 2 illustrates a PAM-4 coding example of a sequence of MSBs and a sequence of LSBs encoded into the PAM-4 signal levels. In the illustrative example according to FIG. 2, the PAM-4 signal includes the sequence of the signal levels L1, L0, L2, L3, L2, L3, L0, L0, L1.

Figure 3:
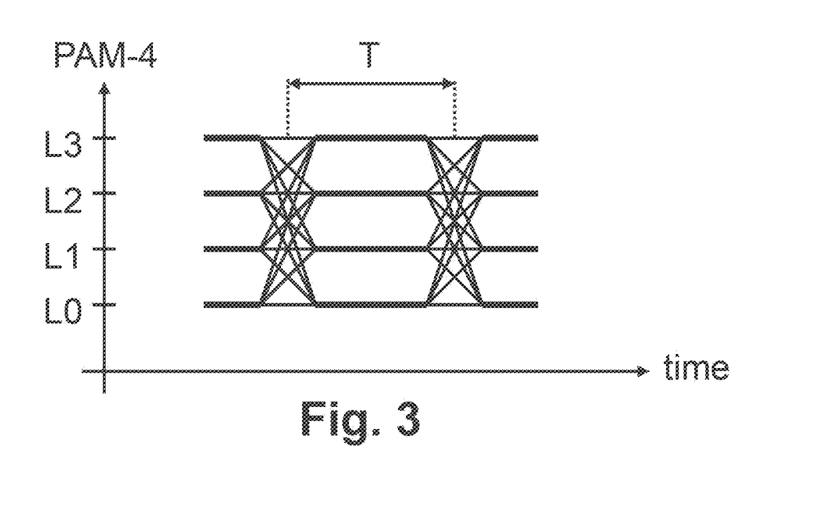
FIG. 3 illustrates a PAM-4 output eye diagram.

FIG. 3 illustrates a PAM-4 output eye diagram, wherein the horizontal axis refers to time, and wherein the vertical axis refers to the PAM-4 signal levels L0, L1, L2, and L3. For a baud rate of 28 GBd/s, the symbol duration T is about 36 ps. For a baud rate of 56 GBd/s, the symbol duration T is about 18 ps. As illustrated in the eye diagram, between successive symbols, any change in the level of the PAM-4 signal is possible, including that the level of the PAM-4 signal does not change between successive symbols. As illustrated in FIG. 3, the first signal level L 1 is larger than the zeroth signal level, the second signal level L2 is larger than the first signal level L1, and the third signal level L3 is larger than the second signal level L2.

Figure 4:
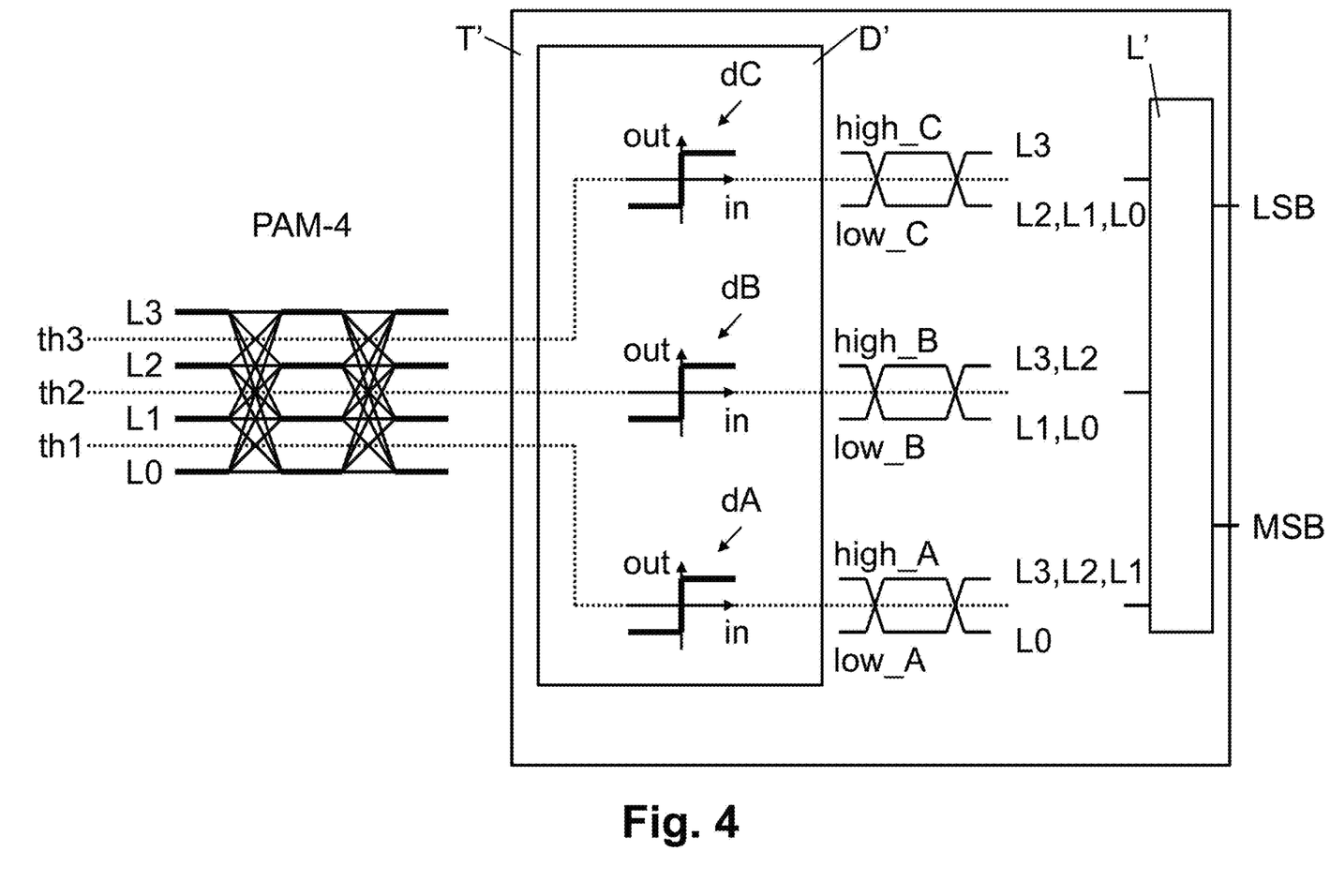
FIG. 4 illustrates a decoder circuit for decoding a PAM-4 signal.

FIG. 4 illustrates a decoder circuit T' for decoding a PAM-4 signal into a LSB bit stream and an MSB bit stream. As illustrated in FIG. 4, the PAM-4 signal includes four signal levels L0, L1, L2, L3. The decoder circuit T' includes a decision block D' and a logic circuit L'.

As illustrated in FIG. 4, the decision block D' includes three decision circuits dA, dB, dC, which are denominated with labels A, B, C.

In some disclosures, decision circuits, such as the decision circuits dA, dB, dC illustrated in FIG. 4 and the first decision circuit d1 and the second decision circuit d2 described further below, are denominated as quantizers or similar.

In an embodiment, each of the decision circuits dA, dB, dC receives an input voltage. If the input voltage is below a threshold, such as −1.5 volts, 0.0 volts, +1.0 volts, etc., the respective decision circuit dA, dB, dC generates a low output signal, such as −1.0 volts, −5.0 volts, etc. If the input voltage is above the threshold, the respective decision circuit dA, dB, dC generates a high output signal, such as +1.0 volts, +5.0 volts, etc.

The decision circuit dA denominated with label A detects if the signal level of the PAM-4 signal is below or above the threshold th1, wherein the threshold th1 is the signal level in the middle between PAM-4 signal level L0 and PAM-4 signal level L1. If the signal level of the PAM-4 signal is below the threshold th1, the decision circuit dA denominated with label A generates a low output signal low_A denominated with label A. If the signal level is above the threshold th1, the decision circuit dA generates a high output signal high_A denominated with label A.

Thus, as illustrated in FIG. 4, if the decision circuit dA denominated with label A generates the low output signal low_A denominated with label A, the PAM-4 signal level is detected to be signal level L0. If the decision circuit dA denominated with label A generates the high output signal high_A denominated with label A, the PAM-4 signal level is detected to be either signal level L3, L2, or L1.

As illustrated in FIG. 4, the decision circuit dB denominated with label B and the decision circuit dC denominated with label C operate correspondingly to the decision circuit dA denominated with label A. The decision circuit dB denominated with label B generates a low output signal low_B denominated with label B in case the signal level of the PAM-4 signal is below the second threshold th2, which is the signal level in the middle between the PAM-4 signal level L1 and the PAM-4 signal level L2. The decision circuit dB denominated with label B generates a high output signal high_B denominated with label B in case the signal level is above the second threshold th2. Correspondingly, the decision circuit dC denominated with label C generates a low output signal low_C denominated with label C in case the signal level is below the third threshold th3, which is the signal level in the middle between the PAM-4 signal level L2 and the PAM-4 signal level L3. The decision circuit dC denominated with label C generates a high output signal high_C denominated with label C in case the signal level is above the third threshold th3.

Thus, as illustrated in FIG. 4, if the decision circuit dB denominated with label B generates the low output signal low_B denominated with label B, the PAM-4 signal level is detected to be either signal level L1 or L0. If the decision circuit dB denominated with label B generates the high output signal high_B denominated with label B, the PAM-4 signal level is detected to be either signal level L3 or L2.

Moreover, as illustrated in FIG. 4, if the decision circuit dC denominated with label C generates the low output signal low_C denominated with label C, the PAM-4 signal level is detected to be either signal level L2, L1 or L0. If the decision circuit dC denominated with label C generates the high output signal high_C denominated with label C, the PAM-4 signal level is detected to be signal level L3.

Only in case of the low output signal low_A denominated with label A and the high output signal high_C denominated with label C, the PAM-4 signal level can be directly detected to be signal level L0 or L3. In order to detect the PAM-4 signal level L1 and L2, further processing of the high output signal high_A denominated with label A, the low output signal low_B denominated with label B, the high output signal high_B denominated with label B, and the low output signal low_C denominated with label C is required.

Thus, as illustrated in FIG. 4, a logic circuit L' with a two-level combinatorial logic is required in order to obtain the LSB and MSB bit streams. However, with limited power, a two-level combinatorial logic cannot run at high baud rates such as 28 GBd/s or 25 GBd/s. At high baud rates such as 28 GBd/s or 25 GBd/s, power consumption of a two-level combinatorial logic is high.

In a PAM-4 signal, the PAM-4 signal levels L0, L1, L2, L3 can have specific values, such as −2.0, −1.0, 1.0, 2.0, for example. The values −2.0, −1.0, 1.0, 2.0 can have a specific unit, such as volts, for example. Thus, the signal level L0 may correspond to −2.0 volts, the signal level L1 may correspond to −1.0 volts, the signal level L3 may correspond to +1.0 volts, and the signal level L3 may correspond to +2.0 volts. Moreover, the second threshold th2 may correspond to 0.0 volts, the first threshold th1 may correspond to −1.5 volts, and the third threshold may correspond to +1.5 volts.

The decision block D' has the disadvantage that the design of the decision circuit dA denominated with label A and the decision circuit dC denominated with label C is particularly difficult. The design of the decision circuit dB denominated with label B is less difficult, because the decision as regards threshold th2 can be simply based on an average signal level. However, such a simple implementation is not possible for the decision circuit dA denominated with label A nor for the decision circuit dC denominated with label C.

Thus, decoding a PAM-4 signal as illustrated in FIG. 4 has the disadvantages that: (1) the design of the decision block D', in particular the design of decision circuits dA, dC denominated with labels A,C, is difficult and that (2) an additional two-level combinatorial logic circuit L' is required in order to determine the PAM-4 signal levels and to decode the PAM-4 signal, which requires high power at high baud rates.

US20150055694 relates to a phase detector having a detection logic for detecting data in a communication signal, amplitude detection logic for processing modulation of a PAM-2 and/or a PAM-4 communication modality, in-phase edge detection logic, quadrature edge detection logic, and a mixing logic for determining an amount of in-phase edge information and quadrature edge information to be applied based on at least one channel parameter in the communication channel.

U.S. Pat. No. 7,283,596 discloses a PAM-4 data slicer which includes a first, second, and third comparator which provide first, second, and third thresholds. Each comparator has an offset. The first and third comparators have an offset generating arrangement at their outputs to provide the first and third comparator circuits with symmetrical offsets.

U.S. Pat. No. 7,505,541 discloses a multi-mode phase and data detector. Based on a selectable bias level, latched comparators operate to detect the multi-level input data signal as it crosses a plurality of threshold levels. Logic selects subsets of exclusive OR gates and subsets of latching comparators to place the multi-mode phase and data detector in a PAM-4, NRZ, or PRML mode of operation.

SUMMARY

Disclosed is a decoder circuit for decoding a pulse amplitude modulation signal having a zeroth signal level, a first signal level, a second level and a third signal level, wherein the first signal level is larger than the zeroth signal level, wherein the second signal level is larger than the first signal level, and wherein the third signal level is larger than second signal level.

The decoder circuit comprises a first decision circuit, a mapping circuit, and optionally a logic circuit.

The decoder circuit comprises a first decision circuit, which receives the pulse amplitude modulation signal and generates a low output signal for the first and the zeroth signal level, and generates a high output signal for the third and the second signal level.

The decoder circuit comprises a mapping circuit, which receives the pulse amplitude modulation signal and generates a low output signal for the second and first signal level, and generates a high output signal for the third and zeroth signal level.

Optionally, the decoder circuit comprises a logic circuit, which receives the generated signal of the mapping circuit and the generated signal of the first decision circuit and generates a low output signal or a high output signal according to a predetermined truth table.

The decoder circuit has the advantage of a simple design. The decoder circuit uses less gates than prior art solutions. The decoder circuit uses less power than prior art solutions. The decode circuit operates at higher baud rates than prior art solutions.

In a variant of the decoder circuit, the mapping circuit includes a rectifier circuit and a second decision circuit, wherein the rectifier circuit receives the pulse amplitude modulation signal and generates a rectified signal with respect to a threshold between the first signal level and the second signal level, wherein the second decision circuit receives the rectified signal and generates the low output signal and the high output signal. The decoder circuit has the advantage of a particularly simple design, because any of the circuits involved operates with respect to an average signal level.

In a variant of the decoder circuit, the logic circuit generates the low output signal and the high output signal according to a XNOR truth table. The XNOR truth table defines the logical complement of the exclusive OR (XOR) truth table. The decoder circuit has the advantage of a particularly simple design, because a logic circuit implementing an XNOR function only requires simple circuits.

In a variant of the decoder circuit, the pulse amplitude modulation signal has symmetric signal values.

In a variant of the decoder circuit, the zeroth signal level is the negative of the third signal level, and the first signal level is the negative of the second signal level.

In a variant of the decoder circuit, the pulse amplitude modulation signal has a predefined baud rate, in particular 28 GBd/s or 56 GBd/s.

In a variant of the decoder circuit, the pulse amplitude modulation signal represents a most significant bit equal to zero and a least significant bit equal to zero by the zeroth signal level, and the most significant bit equal to zero and the least significant bit equal to one by the first signal level, and the most significant bit equal to one and the least significant bit equal to zero by the second signal level, and the most significant bit equal to one and the least significant bit equal to one by the third signal level.

In a variant of the decoder circuit, the output of the first decision circuit is designed to provide the most significant bit, and the output of the logic circuit is designed to provide the least significant bit.

In a variant of the decoder circuit, the pulse amplitude modulation signal represents by the zeroth signal level, by the first signal level, by the second signal level and by the third signal level a most significant bit and a least significant bit in accordance to a Gray code. In case of a Gray code, if the decoder circuit detects a wrong signal level, only one of the most significant bit and the least significant bit is wrongly detected because only one of the most significant bit and the least significant bit changes between signal levels.

In a variant of the decoder circuit, the pulse amplitude modulation signal represents a most significant bit equal to zero and a least significant bit equal to zero by the zeroth signal level, and the most significant bit equal to zero and the least significant bit equal to one by the first signal level, and the most significant bit equal to one and the least significant bit equal to one by the second signal level, and the most significant bit equal to one and the least significant bit equal to zero by the third signal level. The most significant bit and the least significant bit are assigned to the signal levels in accordance to a specific Gray code.

In a variant of the decoder circuit, wherein the output of the first decision circuit is designed to provide the most significant bit, and the output of the mapping circuit is designed to provide the least significant bit. In case of specific codes as regards the assignment of the most significant bit and the least significant bit to the signal levels, the first decision circuit provides the most significant bit and the mapping circuit provides the least significant bit. In case of other specific codes, such as the specific Gray code described above, the output of the first decision circuit provides the most significant bit and the output of the mapping circuit provides for the inverted least significant bit. In case of differential logic gates (e.g. a SiGe chip design, SiGe: silicon germanium), both the non-inverted signal and the inverted signal are readily available and no further logic circuit is required.

Beside a decoder circuit for decoding a pulse amplitude modulation signal, disclosed is a method of decoding a pulse amplitude modulation signal having a zeroth signal level, a first signal level, a second signal level and a third signal level, wherein the first signal level is larger than the zeroth signal level, wherein the second signal level is larger than the first signal level, and wherein the third signal level is larger than second signal level. The method comprises a first step of receiving the pulse amplitude modulation signal and generating a low output signal for the first and the zeroth signal level, and generating a high output signal for the third and the second signal level. The method comprises a second step of receiving the pulse amplitude modulation signal and generating a low output signal for the second and first signal level, and generating a high output signal for the third and zeroth signal level. The method comprises a third step of receiving the generated signal of the second step and the generated signal of the first step and generating a low output signal or a high output signal according to a predetermined truth table.

In a variant of the method of decoding a pulse amplitude modulation signal, the second step includes receiving the pulse amplitude modulation signal and generating a rectified signal with respect to a threshold between the first signal level and the second signal level, and wherein the second step further includes receiving the rectified signal and generating the low output signal and the high output signal.

In a variant of the method of decoding a pulse amplitude modulation signal, the third step includes generating the low output signal and the high output signal according to a XNOR truth table.

In a variant of the method of decoding a pulse amplitude modulation signal, the pulse amplitude modulation signal has symmetric signal values.

In a variant of the method of decoding a pulse amplitude modulation signal, the zeroth signal level is the negative of the third signal level, and the first signal level is the negative of the second signal level.

In a variant of the method of decoding a pulse amplitude modulation signal, the pulse amplitude modulation signal has a predefined baud rate, in particular 28 GBd/s or 56 GBd/s.

In a variant of the method of decoding a pulse amplitude modulation signal, the pulse amplitude modulation signal represents a most significant bit equal to zero and a least significant bit equal to zero by the zeroth signal level, and the most significant bit equal to zero and the least significant bit equal to one by the first signal level, and the most significant bit equal to one and the least significant bit equal to zero by the second signal level, and the most significant bit equal to one and the least significant bit equal to one by the third signal level.

In a variant of the method of decoding a pulse amplitude modulation signal, in the first step the most significant bit is provided, and in the third step the least significant bit is provided.

In a variant of the method of decoding a pulse amplitude modulation signal, the pulse amplitude modulation signal represents by the zeroth signal level, by the first signal level, by the second signal level and by the third signal level a most significant bit and a least significant bit in accordance to a Gray code.

In a variant of the method of decoding a pulse amplitude modulation signal, the pulse amplitude modulation signal represents a most significant bit equal to zero and a least significant bit equal to zero by the zeroth signal level, and the most significant bit equal to zero and the least significant bit equal to one by the first signal level, and the most significant bit equal to one and the least significant bit equal to one by the second signal level, and the most significant bit equal to one and the least significant bit equal to zero by the third signal level.

In a variant of the method of decoding a pulse amplitude modulation signal, in the first step the most significant bit is provided, and in the second step the least significant bit is provided.

BRIEF DESCRIPTION OF THE DRAWINGS

In order to describe the manner in which advantages and features of the disclosure can be obtained, in the following a more particular description of the principles briefly described above will be rendered by reference to specific embodiments thereof which are illustrated in the appended drawings. These drawings depict only exemplary embodiments of the disclosure and are not therefore to be considered to be limiting of its scope. The principles of the disclosure are described and explained with additional specificity and detail through the use of the accompanying drawings in which.

DETAILED DESCRIPTION

FIGS. 1-4 relate to PAM-4 signals and to the decoding of a PAM-4 signal according to the prior art. FIGS. 1-4 are descried in the above section "background".

Figure 5:
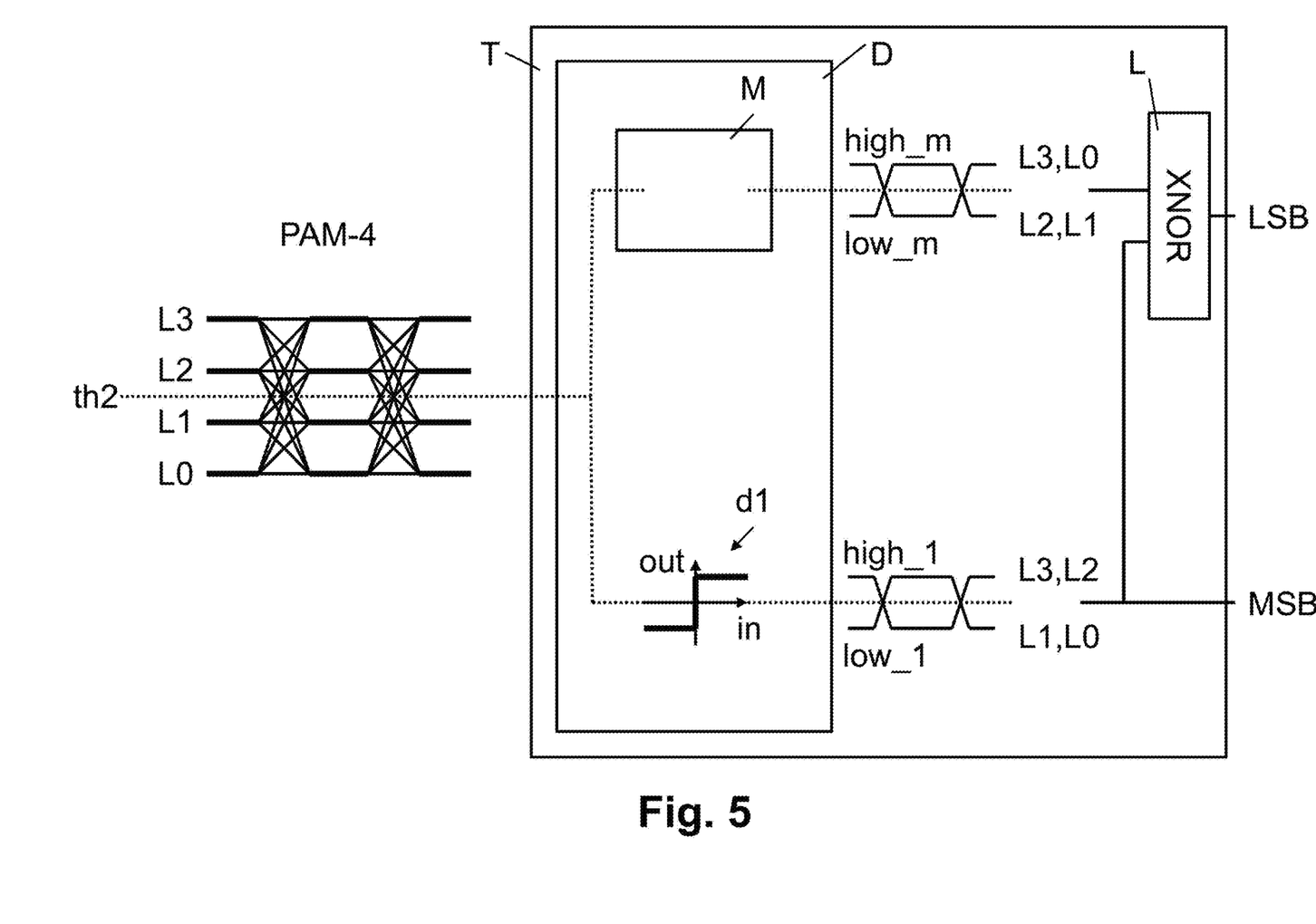
FIG. 5 illustrates a decoder circuit according to the invention.

FIG. 5 illustrates a decoder circuit T according to the invention. The decoder circuit T enables decoding of a PAM-4 signal into a MSB bit stream and a LSB bit stream. The decoder circuit T includes a decision block D and a logic circuit L.

The decision block D includes a mapping circuit M and a first decision circuit d1.

The mapping circuit M, which will be described in more detail below, maps the PAM-4 signal onto a high output signal high_m if the PAM-4 signal level is L3 or L0. The mapping circuit M maps the PAM-4 signal onto a low output signal low_m if the PAM-4 signal level is L2 or L1.

The first decision circuit d1 illustrated in FIG. 5 operates the same as the decision circuit dB denominated with label B of the embodiment illustrated in FIG. 4. The first decision circuit d1 generates a high output signal high_1 if the PAM-4 signal level is above threshold th2, which is the threshold between the PAM-4 signal level L1 and L2. The first decision circuit d1 generates a low output signal low_1 if the PAM-4 signal level is below threshold th2. Thus, as illustrated in FIG. 5, if the PAM-4 signal level is L3 or L2, the output of the first decision circuit d1 is the high output signal high_1. If the PAM-4 signal level is L1 or L0, the output of the first decision circuit d1 is the low output signal low_1.

In accordance to the coding table illustrated in FIG. 1, the output of the first decision circuit d1 generates the MSB bit stream, because if the output of the first decision circuit d1 is the low output signal low_1, the signal level is L1 or L0, which corresponds to MSB=0, and if the output of the first decision circuit d1 is the high output signal high_1, the signal level is L3 or L2, which corresponds to MSB=1. Thus, the output of the first decision circuit d1 generates directly the MSB bit stream.

Figure 6:
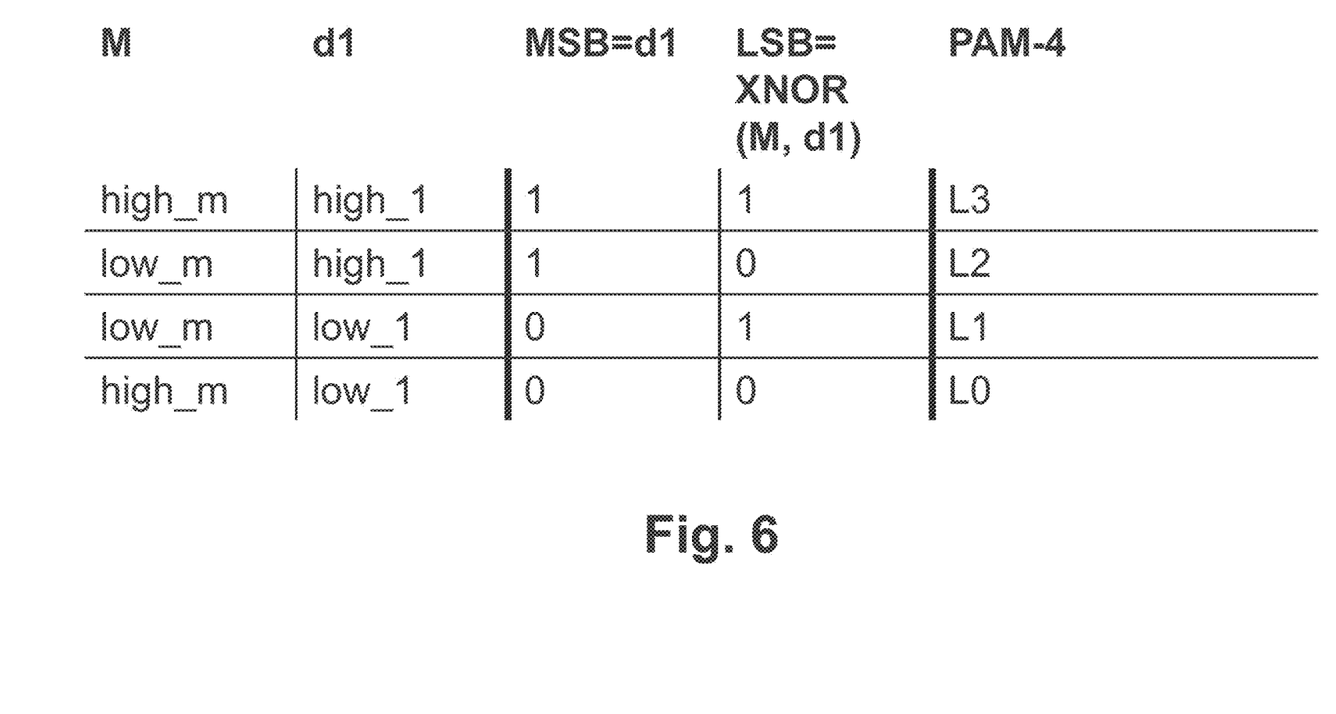
FIG. 6 illustrates the correspondence between signals of the decoder circuit and the PAM-4 signal levels.

FIG. 6 illustrates the correspondence between signals of the decoder circuit and the PAM-4 signal levels, in particular how the high and low output signals high_m, low_m of the mapping circuit M respectively of the high and low output signals high_1, low_1 of the first decision circuit d1 correspond to the PAM-4 signal levels L0, L1, L2, and L3. The case when mapping circuit M generates a high output signal high_m and the first decision circuit d1 generates a low output signal low_1 corresponds to the PAM-4 signal level L0. The case when the mapping circuit M generates a low output signal low_m and the first decision circuit d1 generates a low output signal low_1 corresponds to the PAM-4 signal level L1. The case when the mapping circuit M generates a low output signal low_m and the output of the first decision circuit d1 generates a high output signal high_1 corresponds to the PAM-4 signal level L2. The case when the mapping circuit M generates a high output signal high_m and the first decision circuit d1 generates a high output signal high_1 corresponds to the PAM-4 signal level L3.

As illustrated in FIG. 5, the logic circuit L receives the output of the mapping circuit M and receives the output of the first decision circuit d1 and generates the LSB bit stream. As illustrated in FIG. 6, the truth table for the logic circuit L corresponds to a simple XNOR gate. Thus, a simple XNOR gate is sufficient for generating the LSB bit stream on the basis of the signals of the mapping circuit M and the decision circuit d2.

Figure 7:
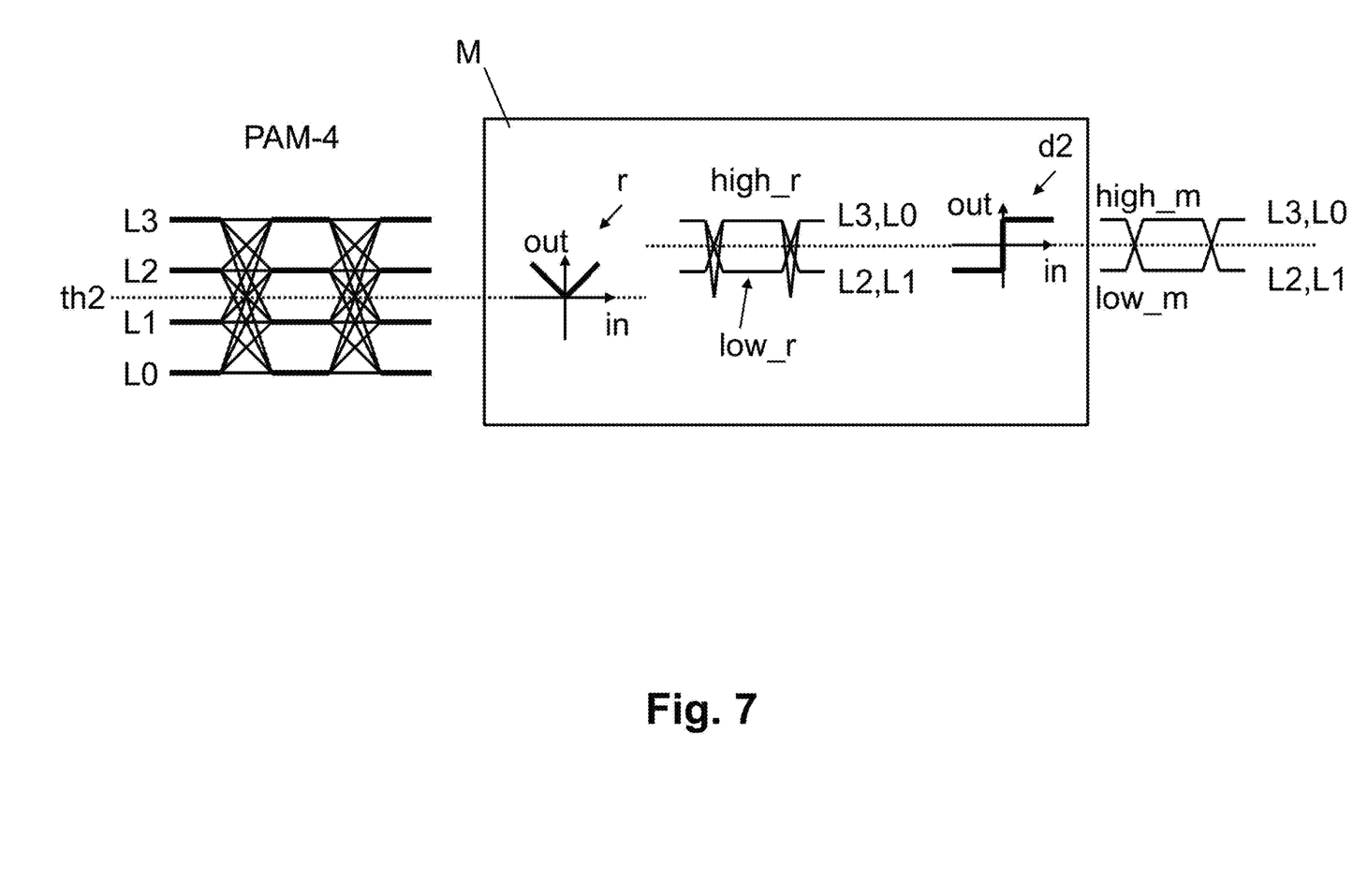
FIG. 7 illustrates an embodiment of the mapping circuit.

FIG. 7 illustrates an embodiment of the mapping circuit M. The mapping circuit M ac-cording to FIG. 7 includes a rectifier circuit r and a second decision circuit d2.

The rectifier circuit r operates with respect to the threshold th2. As described above, in an embodiment the threshold th2 is 0.0 volts. As illustrated in FIG. 7, the rectifier circuit r receives the PAM-4 signal and generates the rectified signal, which includes the part of the PAM-4 signal above the threshold th2 and the part of the PAM-4 signal below the threshold th2 mirrored upwards with respect to the threshold th2. The output of the rectifier circuit r includes the output low_r, which corresponds to the PAM-4 signal levels L2, L1, and the output high_r, which corresponds to the PAM-4 signal levels L3, L0.

The design of the rectifier circuit r is simple, because rectification can be simply based on an average signal level.

As illustrated in FIG. 7, the second decision circuit d2 receives the output of the rectifier circuit r and generates the low output signal low_m if the output of the rectifier circuit is below a threshold indicated by a dashed line in FIG. 7, or generates the high output signal high_m if the output of the rectifier circuit is above the indicated threshold.

As in the case of the first decision circuit d1, the design of the second decision circuit d2 is simple, because the decision as regards the indicated threshold can be simply based on an average signal level. The second decision circuit generates d2 generates the low output signal low_m when the PAM-4 signal level is L2 or L1, and generates the high output signal high_m when the PAM-4 signal level is L3 or L0.

Thus, the mapping circuit M illustrated in FIG. 7 provides for a mapping of the PAM-4 signal onto a high output signal high_m if the PAM-4 signal level is L3 or L0, and provides for a mapping of the PAM-4 signal onto a low output signal low_m if the PAM-4 signal level is L2 or L1.

The first decision circuit d1, the rectifier circuit r, and the second decision circuit d2 can be implemented on the basis of transistors, current sources, resistors, and capacitors. The first decision circuit d1, the rectifier circuit r, and the second decision circuit d2 are well suited for implementation using various chip technologies, such as bipolar technologies, etc.

Figure 8:
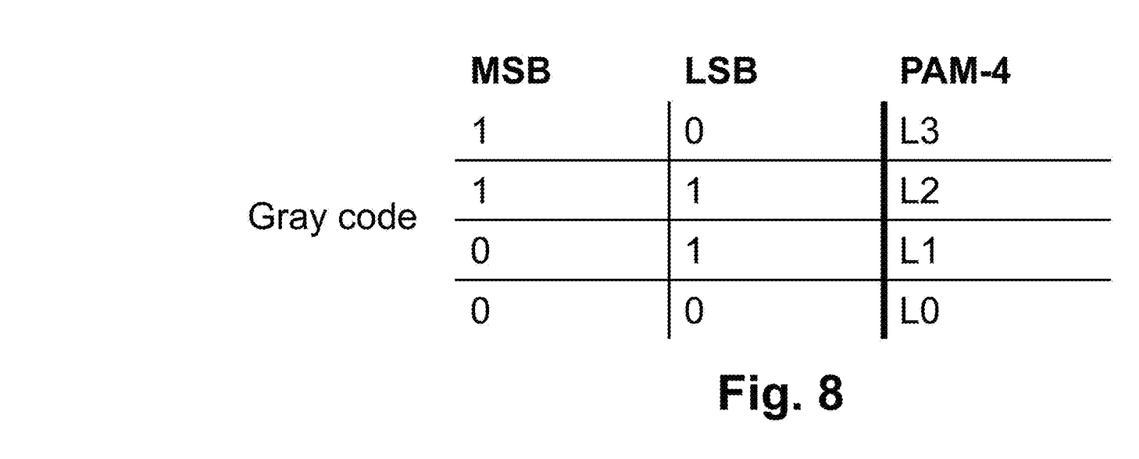
FIG. 8 illustrates a PAM-4 coding table in accordance to a Gray code.

FIG. 8 illustrates a PAM-4 coding table in accordance to a Gray code. FIG. 8 corresponds to FIG. 1. However, in case of a Gray code, only one of the most significant bit MSB and the least significant bit LSB changes between signal levels L0, L1, L2, L3.

Figure 9:
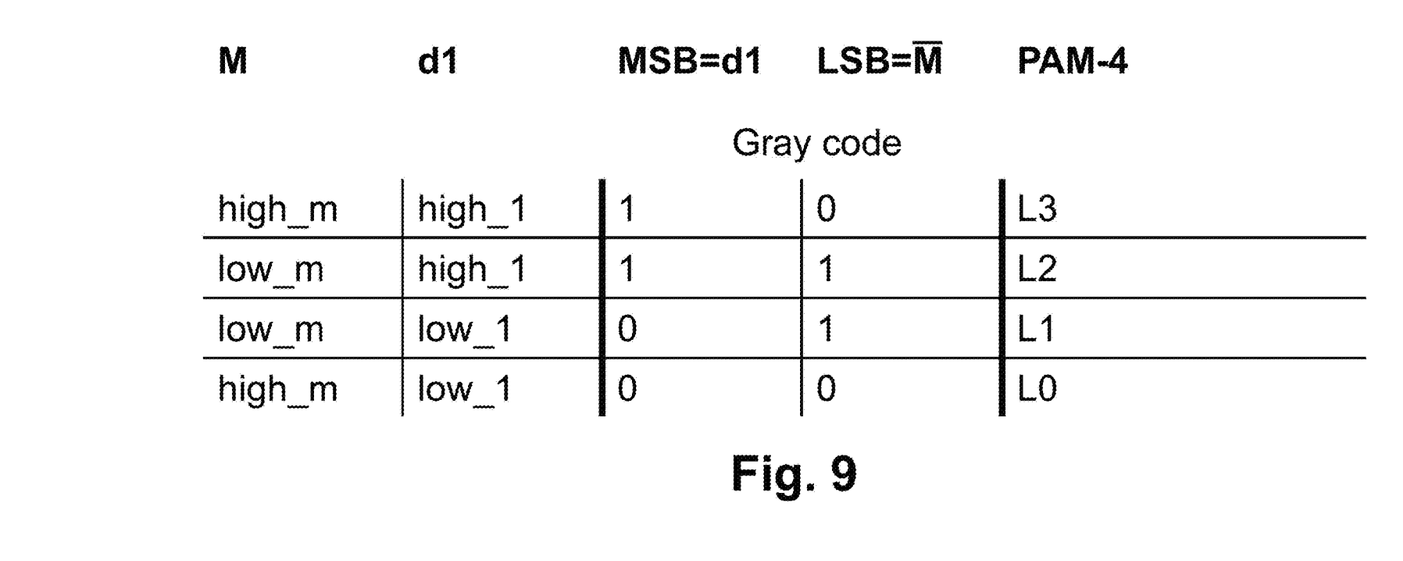
FIG. 9 illustrates the correspondence between signals of the decoder circuit and the PAM-4 signal levels in case of a Gray code.

FIG. 9 illustrates the correspondence between signals of the decoder circuit and the PAM-4 signal levels in case of a Gray code. FIG. 9 corresponds to FIG. 6. The output of the first decision circuit d1 provides the most significant bit MSB. However, the output of the mapping circuit M provides the inverted least significant bit LSB. In case of differential logic gates (e.g. a SiGe chip), both the non-inverted signal and the inverted signal are readily available, and thus, the least significant bit LSB is readily available.

Figure 10:
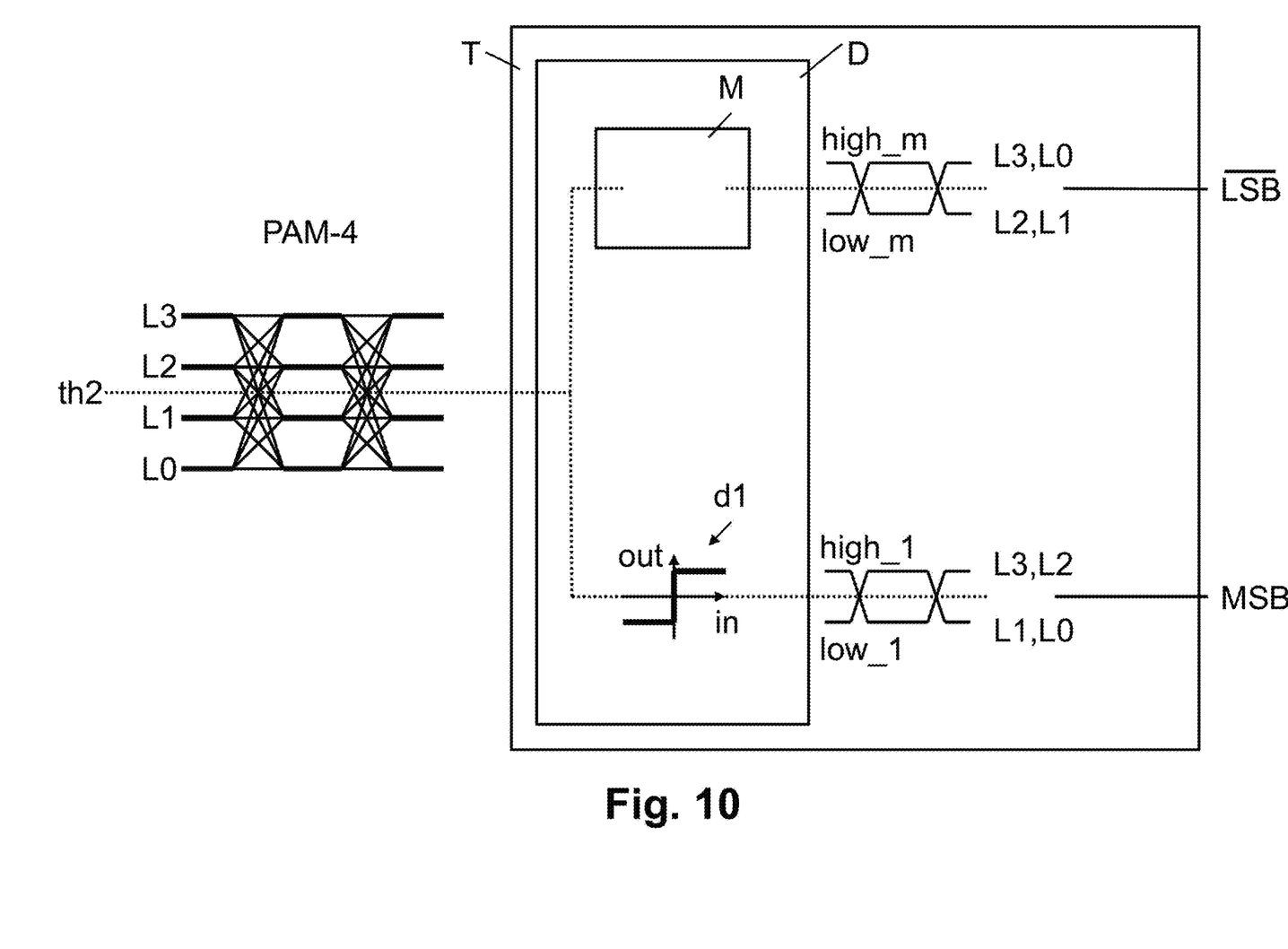
FIG. 10 illustrates a decoder circuit for decoding a PAM-4 signal in case of a Gray code.

FIG. 10 illustrates a decoder circuit for decoding a PAM-4 signal in case of a Gray code. FIG. 10 corresponds to FIG. 5. However, at the output of the mapping circuit M, no logic circuit is required, because the inverted least significant bit LSB is directly provided by the mapping circuit M. In case of differential logic gates (e.g. a SiGe chip), both the non-inverted signal and the inverted signal are readily available.

Figure 11:
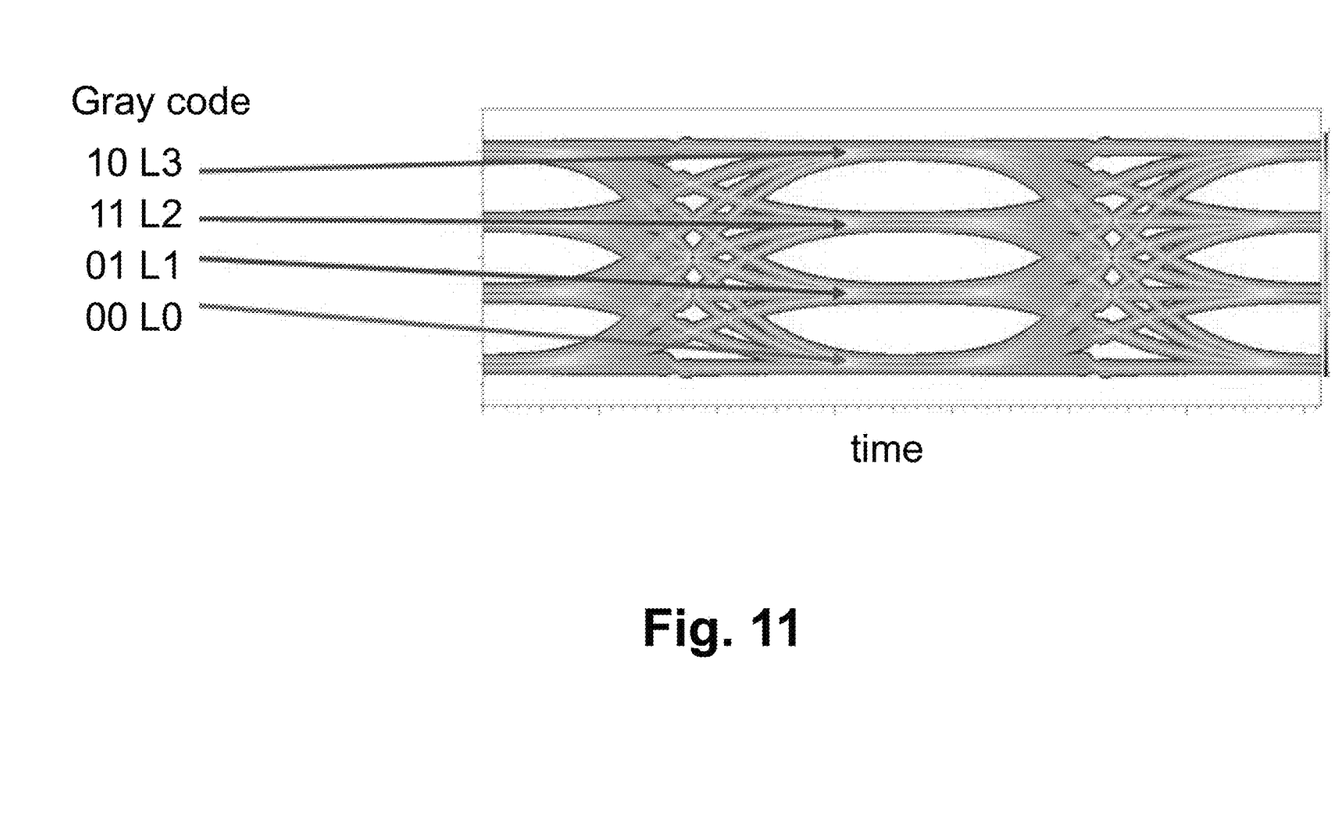
FIG. 11 illustrates a PAM-4 output eye diagram and a Gray code assigned to the signal levels.

FIG. 11 illustrates a PAM-4 output eye diagram and a Gray code assigned to the signal levels. The most significant bit MSB and the least significant bit LSB are assigned to the signal levels L0, L1, L2, L3 in accordance to the coding table of FIG. 8.

It should be emphasized that the above-described embodiments of the present disclosure are merely possible examples of the present disclosure set forth for a clear understanding of the principles of the disclosure. Many variations and modifications may be made to the above-described embodiments without departing substantially from the spirit and principles of the disclosure. All such modifications and variations are intended to be included herein within the scope of this disclosure and protected by the following claims.

What is claimed is:

1. A decoder circuit for decoding a pulse amplitude modulation signal having a zeroth signal level, a first signal level, a second signal level and a third signal level, wherein the first signal level is larger than the zeroth signal level, wherein the second signal level is larger than the first signal level, and wherein the third signal level is larger than second signal level, the decoder circuit comprising:
a first decision circuit, which receives the pulse amplitude modulation signal and generates a low output signal for the first and the zeroth signal level, and generates a high output signal for the third and the second signal level, and
a mapping circuit, which receives the pulse amplitude modulation signal and generates a low output signal for the second and first signal level, and generates a high output signal for the third and zeroth signal level,
wherein the mapping circuit includes a rectifier circuit and a second decision circuit, wherein the rectifier circuit receives the pulse amplitude modulation signal and generates a rectified signal with respect to a threshold between the first signal level and the second signal level, wherein the rectified signal is the output of the rectifier circuit, wherein the second decision circuit receives the rectified signal and generates the low output signal and the high output signal.

2. The decoder circuit of claim 1, further comprising a logic circuit, which receives the generated signal of the mapping circuit and the generated signal of the first decision circuit and generates a low output signal or a high output signal according to a predetermined truth table.

3. The decoder circuit of claim 2, wherein the logic circuit generates the low output signal and the high output signal according to a XNOR truth table.

4. The decoder circuit of claim 2, wherein the pulse amplitude modulation signal represents a most significant bit equal to zero and a least significant bit equal to zero by the zeroth signal level, and the most significant bit equal to zero and the least significant bit equal to one by the first signal level, and the most significant bit equal to one and the least significant bit equal to zero by the second signal level, and the most significant bit equal to one and the least significant bit equal to one by the third signal level.

5. The decoder circuit of claim 4, wherein the output of the first decision circuit is designed to provide the most significant bit, and the output of the logic circuit is designed to provide the least significant bit.

6. The decoder circuit of claim 1, wherein the pulse amplitude modulation signal has symmetric signal values.

7. The decoder circuit of claim 1, wherein the zeroth signal level is the negative of the third signal level, and the first signal level is the negative of the second signal level.

8. The decoder circuit of claim 1, wherein the pulse amplitude modulation signal has a predefined baud rate, in particular 28 GBd/s or 56 GBd/s.

9. The decoder circuit of claim 1, wherein the pulse amplitude modulation signal represents by the zeroth signal level, by the first signal level, by the second signal level and by the third signal level a most significant bit and a least significant bit in accordance to a Gray code.

10. The decoder circuit of claim 1, wherein the pulse amplitude modulation signal represents a most significant bit equal to zero and a least significant bit equal to zero by the zeroth signal level, and the most significant bit equal to zero and the least significant bit equal to one by the first signal level, and the most significant bit equal to one and the least significant bit equal to one by the second signal level, and the most significant bit equal to one and the least significant bit equal to zero by the third signal level.

11. The decoder circuit of claim 10, wherein the output of the first decision circuit is designed to provide the most significant bit, and the output of the mapping circuit is designed to provide the least significant bit.

12. A method of decoding a pulse amplitude modulation signal having a zeroth signal level, a first signal level, a second signal level and a third signal level, wherein the first signal level is larger than the zeroth signal level, wherein the second signal level is larger than the first signal level, and wherein the third signal level is larger than second signal level, the method comprising:
a first step of receiving the pulse amplitude modulation signal and generating a low output signal for the first and the zeroth signal level, and generating a high output signal for the third and the second signal level, and
a second step of receiving the pulse amplitude modulation signal and generating a low output signal for the second and first signal level, and generating a high output signal for the third and zeroth signal level,
wherein the second step includes receiving the pulse amplitude modulation signal and generating a rectified signal with respect to a threshold between the first signal level and the second signal level, wherein the rectified signal is the output of a rectifier circuit, and wherein the second step further includes receiving the rectified signal and generating the low output signal and the high output signal.

13. The method of claim 12, further comprising a third step of receiving the generated signal of the second step and the generated signal of the first step and generating a low output signal or a high output signal according to a predetermined truth table.

14. The method of claim 13, wherein the third step includes generating the low output signal and the high output signal according to a XNOR truth table.

15. The method of claim 13, wherein the pulse amplitude modulation signal represents a most significant bit equal to zero and a least significant bit equal to zero by the zeroth signal level, and the most significant bit equal to zero and the least significant bit equal to one by the first signal level, and the most significant bit equal to one and the least significant bit equal to zero by the second signal level, and the most significant bit equal to one and the least significant bit equal to one by the third signal level.

16. The method of claim 15, wherein in the first step the most significant bit is provided, and in the third step the least significant bit is provided.

17. The method of claim 12, wherein the pulse amplitude modulation signal has symmetric signal values.

18. The method of claim 12, wherein the zeroth signal level is the negative of the third signal level, and the first signal level is the negative of the second signal level.

19. The method of claim 12, wherein the pulse amplitude modulation signal has a predefined baud rate, in particular 28 GBd/s or 56 GBd/s.

20. The method of claim 12, wherein the pulse amplitude modulation signal represents by the zeroth signal level, by the first signal level, by the second signal level and by the third signal level a most significant bit and a least significant bit in accordance to a Gray code.

21. The method of claim 12, wherein the pulse amplitude modulation signal represents a most significant bit equal to zero and a least significant bit equal to zero by the zeroth signal level, and the most significant bit equal to zero and the least significant bit equal to one by the first signal level, and the most significant bit equal to one and the least significant bit equal to one by the second signal level, and the most significant bit equal to one and the least significant bit equal to zero by the third signal level.

22. The method of claim 21, wherein in the first step the most significant bit is provided, and in the second step the least significant bit is provided.

* * * * *